United States Patent [19]

Heard et al.

[11] Patent Number: 4,712,222
[45] Date of Patent: Dec. 8, 1987

[54] ADAPTIVE RECURSIVE PHASE OFFSET TRACKING SYSTEM

[75] Inventors: Charles M. Heard, Venice; Frank C. Yang, Anaheim, both of Calif.

[73] Assignee: Hughes Aircraft Company, Los Angeles, Calif.

[21] Appl. No.: 745,814

[22] Filed: Jun. 17, 1985
(Under 37 CFR 1.47)

Related U.S. Application Data

[63] Continuation-in-part of Ser. No. 328,178, Dec. 7, 1981, abandoned.

[51] Int. Cl.$^4$ .............................................. H03D 1/24
[52] U.S. Cl. ........................................ 375/77; 375/97
[58] Field of Search ................... 343/417, 420; 375/39, 375/77, 97; 455/60, 202, 203, 265, 266

[56] References Cited

U.S. PATENT DOCUMENTS

| | | | |
|---|---|---|---|
| 3,482,246 | 12/1969 | Cox | 343/420 |
| 3,669,511 | 9/1970 | Motley | 455/202 X |
| 3,701,948 | 10/1972 | McAuliffe | 455/202 X |
| 3,828,138 | 8/1974 | Fletcher et al. | 455/265 |
| 3,909,735 | 9/1975 | Anderson et al. | 455/265 X |
| 3,980,971 | 9/1976 | Sato | 375/39 X |
| 4,090,145 | 5/1978 | Webb | 375/77 X |
| 4,193,035 | 3/1980 | Berger | 455/203 |
| 4,213,096 | 7/1980 | Daniel, Jr. | 455/265 X |
| 4,447,910 | 5/1984 | Smith et al. | 375/99 |

OTHER PUBLICATIONS

Harry L. Van Trees, "Detection Estimation and Modulation Theory", John Wiley and Sons, New York, 1968, pp. 335–349.

*Primary Examiner*—Harvey E. Behrend
*Assistant Examiner*—Brian S. Steinberger
*Attorney, Agent, or Firm*—S. M. Mitchell; M. J. Meltzer; A. W. Karambelas

[57] ABSTRACT

This invention provides improved performance and reduced cost relative to conventional carrier phase tracking systems. The invention improves the performance of the communication system by rapidly acquiring and reliably tracking the carrier signal with substantially digital hardware. The invention has no reverse slope null characteristic and therefore does not suffer from hangup. As such, acquisition time is independent of phase error. These solutions are provided without the added expense and calibration problems of a crystal filter or the performance compromise of the dual phase detector phase locked loop.

The invention includes circuitry which removes the carrier from the received data signal and converts the signal to a complex baseband signal. The baseband signal is subsequently sampled to provide a plurality of complex samples. The phase of each sample is extracted and compared to the phase of an adjacent sample to provide phase difference signals. The phase difference signals are then applied to phase shifting circuitry which substantially compensates for the phase offset in the received data signal.

6 Claims, 1 Drawing Figure

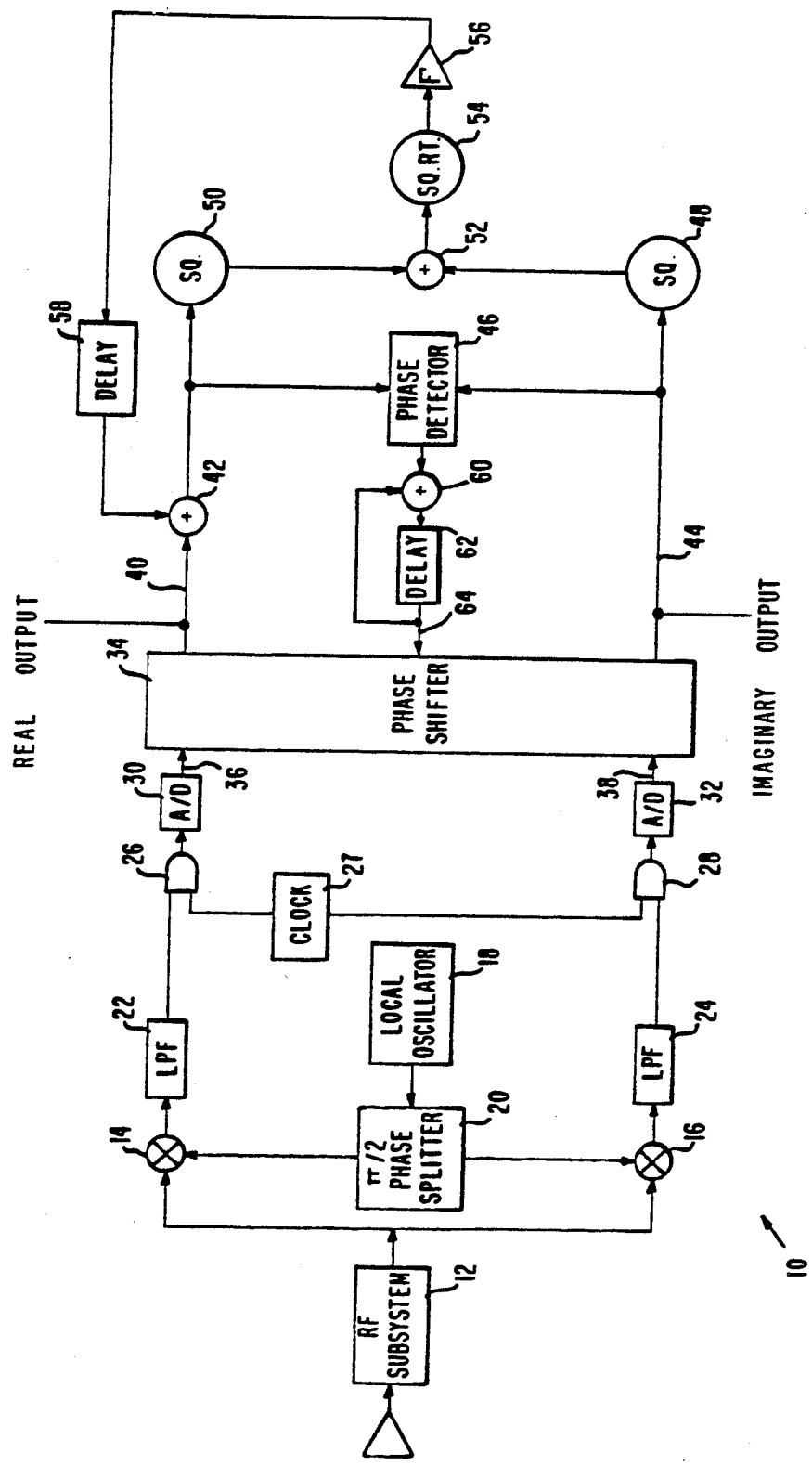

ADAPTIVE RECURSIVE PHASE OFFSET TRACKING SYSTEM

This is a continuation-in-part of application Ser. No. 06/328,178, filed Dec. 7, 1981, now abandoned.

BACKGROUND OF THE INVENTION

1. Field of the Invention

This invention relates to radio receivers. More specifically, this invention relates to communications modems which incorporate phase tracking systems.

While the present invention is described herein with reference to particular embodiments and applications, it is to be understood that the invention is not limited thereto. Those of ordinary skill in the art having access to the teachings of this invention will recognize additional applications and embodiments within the scope thereof.

2. Description of the Prior Art

Many communication systems require rapid acquisition and accurate tracking of a data signal. In many satellite communication systems, such as coherent time division multiple access burst communication systems or coherent communications systems which utilize a fading transmission media, there is a requirement for a rapid initial acquisition (or a rapid reacquisition after a fade) of the signals phase. A coherent system is one which requires long term phase continuity relative to the time constant of the receiver. To facilitate communication, a satellite may send or receive a burst transmission of a coherent signal. The burst typically includes a train of blank pulses and a sequence of bits in a known pattern. The blank pulses are utilized to align the phase of the carrier with that of the local oscillator. The known bit pattern is utilized to ensure alignment of the bit sequence with the sampling mechanism of the receiver. The effectiveness of the communication system is a function of its ability to receive, interpret and align itself with the burst transmission.

Most communication systems typically utilize a phase locked loop to acquire and track the transmitted signal. The phase locked loop typically includes a single phase detector and occasionally exhibits unduly prolonged phase transients during initial acquisition or lock. The loop appears to stick, temporarily, at a large value of phase error before settling to its normal tracking condition of small error. This phenomenon has been dubbed the "hangup" effect and is discussed by Floyd M. Gardner in "Hangup in Phase Locked Loops", IEEE Transactions on Communications, Vol. COM-05, No. 10, October 1977. pp. 1210-1214.

Gardner points out that almost all phase detectors have a periodic characteristic of output voltage versus phase error. Because of the periodicity, the characteristic must have two nulls per cycle. One null has a slope which provides negative feedback for the loop and is the stable null for equilibrium tracking. The other null has a reverse slope which provides unstable, positive feedback so stable tracking about this null is not possible.

Experiments have indicated that if the initial phase error in a phase lock loop is very close to the reverse slope null, the loop can dwell in the vicinity of the null for a prolonged time. This is the "hangup effect".

Since the dwell time at the reverse null is finite, the loop cannot remain indefinitely at the unstable null. It must eventually move away and converge toward the normal equilibrium null assuming that no conditions exist that prevent eventual locking. However, if fast phase acquisition is needed, the hangup interval can be excessively long and can severely degrade the performance of fast time division multiple access sytems. For example, in the burst-mode digital communication system, rapid acquisition is demanded for efficient usage of channel time. Failure of the phase lock loop to settle within the allotted synchronization preamble (burst) prevents correct detection of the indentification preamble and causes loss of the entire burst.

Recent attempts to solve this problem have resulted in the substitution of narrow-band tuned filters for the phase lock loop. These systems typically split the received signal into two paths one of which contains a crystal filter. The crystal filter isolates the carrier which is subsequently reinserted into the second path to demodulate the received signal. Since the crystal filter typically has some delay, there is an alignment/static calibration problem which must be solved in order to ensure proper synchronization of the filtered carrier with the received signal. In addition, the tuned filters are typically expensive, complex and suffer other unwanted characteristics.

Yet another proposed solution suggests the use of a second phase detector in the phase lock loop. These systems are also more expensive, complex requiring more parts and effort in assembly. For example, these systems typically require a voltage controlled oscillator which prevents the system from being completely digital in design. The use of analog circuitry forces a compromise in performance in the acquisition and tracking of the carrier signal.

SUMMARY OF THE INVENTION

The present invention provides improved performance and reduced cost relative to conventional carrier phase tracking systems. The present invention improves the performance of the communication system by rapidly acquiring and reliably tracking the carrier signal with substantially digital hardware. The present invention has no reverse slope null characteristic and therefore does not suffer from hangup. As such, acquisition time is independent of phase error. These solutions are provided without the added expense and callibration problems of a crystal filter nor the performance compromise of the dual phase detector phase lock loop.

The present invention includes circuitry which removes the carrier from the received data signal and converts the signal to a complex baseband signal. The baseband signal is subsequently sampled to provide a plurality of complex samples. The phase error of each sample is extracted and accumulated to create an estimate of the absolute phase offset. The phase estimate is then applied to phase shifting circuitry which substantially compensates for the phase offset in the received data signal.

BRIEF DESCRIPTION OF THE DRAWING

The FIGURE shows a block diagram of an illustrative embodiment of the present invention.

DESCRIPTION OF THE INVENTION

An illustrative embodiment of the present invention 10 is shown in the FIGURE. The RF subsystem 12 is not part of the invention and is shown for the purpose of illustration only. Radio signals received by the RF subsystem 12 are fed into demodulators 14 and 16 which are driven by the cos and the sin of $\omega_o t$ respectively. The sin $\omega_o t$ and cos $\omega_o t$ are generated by the phase splitter 20 which operates on the output of the local oscillator 18. The carrier signal is removed by the demodulators 14 and 16 which simultaneously generate the complex representation of the received signal. The outputs of the demodulators 14 and 16 are filtered by circuits 22 and 24. The filters 22 and 24 are low pass filters typically of the integrate and dump variety. The outputs of the circuits 22 and 24 are switched by gates 26 and 28, respectively, which operate on the control of a clock 27. (For the purposes of this illustration, the remaining clock connections to the circuits of the present invention are not shown. The timing and clocking of the present invention would be obvious to one of ordinary skill in the art.) Analog-to-digital converters (A/D) 30 and 32 are connected between the gates 26 and 28 and the phase shifter 34, respectively. The real part of the complex digital data signal is provided on line 36. The imaginary part of the complex digital data signal is provided on line 38.

The phase shifter 34 effectively corrects the phase of the signal received on lines 36 and 38 by an amount determined by the circuitry to be discussed more fully below. The real part of the signal shifted by the phase shifter 34 appears on line 40 and is input to a summing circuit 42. The imaginary part output of the phase shifter 34 appears on line 44 and is input to a phase detector 46 and a squaring operator 48. The output of the summing circuit 42 is input to the phase detector 46 and a second squaring operator 50. The outputs of the two squaring operators 48 and 50 are combined by summing circuit 52. Square root operator 54 takes the square root of the sum of the inputs from the squaring operators 48 and 50. A damping amplifier 56 multiplies the output of the square root operator by predetermined damping factor F. The output of the damping amplifier 56 is fed back to the summing operator 42 via delay operator 58.

The operation of the present invention can best be understood with reference to the following mathematical discussion. The signals received by the RF subsystem 12 can be assumed to be of the form Z(t). This represents a continuous signal at a center carrier frequency of $\omega_o$. The demodulators 14 and 16 operate with the local oscillator 18 and the phase splitter 20 to remove the carrier signal and create a complex baseband signal from the received signal Z(t). A quadrature mix may be utilized to provide complex baseband signals without departing from the scope of this invention.

The low pass filters 22 and 24 average the received signal Z(t) by integrating over a time interval $T_s$. Gates 26 and 28 are clocked to sample the complex baseband signal to derive a plurality of complex samples. The kth sample of a complex baseband signal may be expressed by the following equation:

$$Z_k = \frac{1}{T_s} \left[ \int_{t-T_s}^{t} Z(t') e^{-j\omega_o t'} dt' \right] \quad t = kT_s \quad [1]$$

Multiplication by $e^{-j\omega_o t}$ represents the action of demodulators 14 and 16. The integral is evaluated at a time t which is equal to the product of the sample number k times the sampling interval $T_s$.

The complex signal on lines 36 and 38 has its carrier component removed, but may have an arbitrary phase offset $\psi$. It is this phase offset which the present invention removes from the baseband signal. Note that $\psi$ must remain essentially constant for intervals which are short compared to the loop bandwidth.

The first sample is passed through the phase shifter 34 to the squaring operators 48 and 50 without correction. The summing circuits 42 and 52, squaring operators 48 and 50, square root operator 54, damping amplifier 56 and delay operator 58 provide means for filtering the output of the phase shifter 34 to remove the effects of noise. The output of the low pass filter is given by the following equation:

$$\rho_k e^{j\hat{\psi}_k} = F\rho_{k-1} e^{j\hat{\psi}_{k-1}} + e^{j\phi_k} \quad [2]$$

where $\phi_k$ is the measured phase offset of the $k^{th}$ input sample $Z_k$ and $\rho_k e^{j\hat{\psi}_k}$ is the output of the low pass filter expressed as a complex quantity; $\hat{\psi}_k$ is the phase of the filter output and $\rho_k$ is the magnitude of the filter output. $\hat{\psi}_{k-1}$ is the estimated phase offset and $F\rho_{k-1}$ is the bandwidth control parameter and a measure of loop tracking quality. F is the damping factor of the filter chosen as a system parameter to determine filter averaging time and thus to control the loop bandwidth. In the absence of noise, $\phi_k$ will assume the constant value $\hat{\psi}$. In that case, the $k^{th}$ filter output is equal to $$\frac{1 - F^k}{1 - F} e^{j\hat{\psi}}.$$

Thus, for $k > 1$, the estimate $\hat{\psi}_{k-1}$ will be equal to the actual phase offset $\hat{\psi}$.

Squaring operators 48 and 50, summer 52 and square root operator 54 cooperate to provide the magnitude of the phasor output of the phase shifter 34. The damping factor F is applied by amplifier 56 and fed back to delay operator 58 so that $F\rho_k$ is stored and becomes $F\rho_{k-1}$ for subsequent iteration. The low pass filter operation may be best explained in polar coordinates. Equation [2] is equivalent to Equations [3] and [4] below. That is, to examine the magnitude $\rho_k$ of Equation [2], one may multiply the right hand side of the equation by the term $e^{j\hat{\psi}_{k-1}}$. This term is an argument term; it does not affect the magnitude $\sigma_k$ which may therefore be expressed by Equation [3] below.

$$\rho_k = \| F\rho_{k-1} + e^{j(\phi_k - \hat{\psi}_{k-1})} \| \quad [3]$$

Equation [3] above provides the magnitude of the filter output and Equation [4] below provides the phase. The phase $\hat{\psi}_k$ is equal to the argument of Equation [3] plus a term which compensates for the multiplication at the right hand side of Equation [2] by $e^{-j\hat{\psi}_{k-1}}$. Thus, $$\hat{\psi}_k = \hat{\psi}_{k-1} + \arg \{F\rho_{k-1} + e^{j(\phi_k - \hat{\psi}_{k-1})}\} \quad [4]$$

The phase detector 46, summing operator 60 and delay operator 62 provide means for extracting the argument term of Equation [4] which represents the phase estimate of the filtered samples. It provides the arguments of the sum of the current phasor with the previous filter output. The delay operator 62 serves to store the previous phase estimate $\hat{\psi}_{k-1}$ and input it to summing circuit 60 where it is added to the current phase detector output. Thus, the updated phase estimate $\hat{\psi}_k$ is input to the phase shifter 34 via line 64.

The phase shifter 34 provides means for correcting the received data signal in response to the phase estimate to substantially compensate for a phase offset in the received data signal. It applies the absolute phase correction to the input signal $Z_k$ and provides an output signal which is the corrected input signal $Z_k e^{-j\hat{\psi}_{k-1}}$.

The embodiment of FIG. 1 is referred to as an illustrative embodiment, because the preferred embodiment of the tracking and filtering subsystem (components 34–62) would be implemented on a digital computer.

A typical program (written in the language PASCAL) is attached. Its inputs are the signals from lines 36 and 38 and its outputs are the signals on lines 40 and 44.

The digital computer program is diagramatically represented by components 34–62. The phase shifter 34 effectively corrects the phase of the signal received on lines 36 and 38 and provides a corrected output signal on lines 40 and 44. The real part of the received signal is provided on line 36, and a corresponding corrected real part of the output signal is provided on line 40. The imaginary part of the received signal is provided on line 38, and a corresponding corrected imaginary part of the output signal is provided on line 44. Components 42 and 46–64 calculate an updated phase estimate, $\hat{\psi}_k$, in a manner described in detail above based upon the corrected signal on lines 40 and 44, and input that updated phase estimate to the phase shifter 34 on line 64.

Thus, the phase correction applied to a signal provided on lines 36 and 38 by the phase shifter 34 is based upon a phase estimate, $\hat{\psi}_k$, calculated based upon previous corrected output signals on lines 40 and 44. A corrected output signal on lines 40 and 44, therefore, can provide both as an output signal from the system 10 and a data signal used by components 42 and 46–64 to calculate an updated phase estimate.

While the present invention has been described above with reference to particular embodiments and applications, it is to be understood that the invention is not limited thereto. Those having ordinary skill in the art and access to the teachings of this invention will recognize additional embodiments and applications within the scope thereof.

For example, a slightly modified version of the present invention may be utilized in systems which employ differential phase shift keyed data demodulation. In these systems, it is necessary to estimate the phase of the signal on a symbol-by-symbol basis. Conventional phase lock loops are unsuitable for this purpose because they cannot track a signal with phase discontinuities. The present invention may be adapted for such applications as follows. The damping parameter F would be set to zero to allow symbol-by-symbol phase estimation, and as a result $\rho_k$ would always be zero. This could be accomplished simply by removing from the illustrative embodiment of FIG. 1 summing circuits 42 and 52, squaring operators 48 and 50, square root operator 54, damping factor amplifier 56 and delay operator 58. In this case, Equation [4] reduces to $$\hat{\psi}_k = \phi_k \qquad [4]$$

so that the output of the system is $$Z_k e^{-j\hat{\psi}_{k-1}} = Z_k e^{-j\phi_{k-1}}. \qquad [5]$$

Since $\phi_{k-1}$ is by definition the argument of $Z_k$, this modified system would implement phase-comparison detection for DPSK signals.

```
1   Program PhaseOffsetTrackingSubsystem(InputFile, OutputFile);
2
3   (* Written in support of PD 79046 by C. M. Heard 21-Sep-81.    *)
4   (* This program demonstrates one method of implementing the    *)
5   (* tracking subsystem of the Adaptive Recursive Phase Offset   *)
6   (* Tracking System. Note that this subsystem does not include  *)
7   (* the demodulator subsystem. The timing circuitry in that     *)
8   (* subsystem must be arranged to produce complex samples with  *)
9   (* a coherent and relatively constant phase relationship.      *)
10  (* The methods used to build such a demodulator would be       *)
11  (* known to a person skilled in the prior art.                 *)
12  (* In this program, the demodulator subsystem is presumed to   *)
13  (* be connected to a computer input/output port which is       *)
14  (* assigned to the logical file InputFile. The buffer          *)
15  (* variable associated with this file is filled with a         *)
16  (* record (consisting of one complex sample from               *)
17  (* the demodulator subsystem) each time a 'reset' or 'get' is  *)
18  (* performed on the file. The required queuing and process     *)
19  (* synchronization is performed by the operating system under  *)
20  (* which this program is run, the details being obvious to a   *)
21  (* person of ordinary skill in the art. Each complex sample    *)
22  (* is represented by a pair of real numbers. Please note that  *)
23  (* that although this representation is preferred, others are  *)
24  (* possible — in particular, complex numbers may be repre-     *)
25  (* sented as pairs of integers — and that the claims should    *)
26  (* be understood to cover all such representations.            *)
27  (* Likewise, phase angles could be represented as two's        *)
28  (* complement integers instead of real numbers as below.       *)
29  (* Output from the Subsystem 10 is directed to the logical     *)
30  (* file OutputFile, which contains records consisting of       *)
```

```
31    (* phase corrected complex samples.  Each record represents  *)
32    (* the output from one clock cycle.  It may be directed       *)
33    (* to any appropriate device, depending on how the invention  *)
34    (* is used.  One record is written on each "put" operation.   *)
 1   Const
 2         Pi = 3.1415926;    (* Used for angle manipulations       *)
 3         F  = 0.9531250;    (* Damping factor of 63/64 selected   *)
 4
 5   Type
 6         Complex = Record
 7                   RealPart, ImagPart: Real;
 8                   End;
 9         InputSample  = Complex;
10         OutputSample = Complex;
11
12   Var
13         (* External Files *)
14         InputFile: File Of InputSample;
15         OutputFile: File Of OutputSample;
16
17         (* State Variables *)
18         PhaseCorrection: Real;
19         TrackQualityIndication: Real;
20
21         (* Working Variables *)
22         PhasorAccumuland: Complex;

1  Procedure AccumulatePhase(Var Accumuland: Real; Increment: Real);
 2    (* Increase Accumuland by Increment and reduce modulo 2*pi *)
 3    (* Implements all modulo 2*Pi Phase Accumulators           *)
 4    Begin
 5      Accumuland := Accumuland+Increment;
 6      If Accumuland >= Pi
 7      Then Accumuland := Accumuland-
 8                        (2.0*Pi)*((Trunc(Accumuland/Pi)+1) Div 2)
 9      Else
10      If Accumuland < -Pi
11      Then Accumuland := Accumuland-
12                        (2.0*Pi)*((Trunc(Accumuland/Pi)-1) Div 2)
13    End;
14
15
16  Procedure ShiftPhase(PhaseShift: Real; InputSample: Complex;
17                                    Var OutputSample: Complex);
18    (* Shift phase of InputSample by amount indicated by PhaseShift *)
19    (* Implements the Phase Shifter                                 *)
20    Var RotPhasor: Complex;
21    Begin
22      RotPhasor.RealPart := Cos(PhaseShift);
23      RotPhasor.ImagPart := Sin(PhaseShift);
24      OutputSample.RealPart := InputSample.RealPart*RotPhasor.RealPart
25                              +
26                              InputSample.ImagPart*RotPhasor.ImagPart;
27      OutputSample.ImagPart := InputSample.ImagPart*RotPhasor.RealPart
28                              -
29                              InputSample.RealPart*RotPhasor.ImagPart;
30    End;

1  Function DetectedPhase(InputSample: Complex): Real;
 2    (* Returns argument of InputSample *)
 3    (* Implements all phase detectors  *)
 4    Begin
 5      With InputSample Do
 6        If RealPart < 0.0
 7        Then Begin
 8          If ImagPart < 0.0
 9          Then DetectedPhase := Arctan(ImagPart/RealPart)-Pi
```

```
10              Else DetectedPhase := Arctan(ImagPart/RealPart)+Pi
11              End
12         Else
13         If RealPart = 0.0
14         Then begin
15              If ImagPart < 0.0
16              Then DetectedPhase := -Pi/2.0
17              else
18              If ImagPart = 0.0
19              Then DetectedPhase := 0.0
20              else
21              If ImagPart > 0.0
22              Then DetectedPhase := +Pi/2.0
23              End
24         Else Begin
25              DetectedPhase := Arctan(ImagPart/RealPart)
26              End
27    End;
28
29
30    (* Implementation of remainder of functions:         *)
31    (* Squaring done with standard function Sqr          *)
32    (* Square root done with standard function Sqrt      *)
1  Begin
2     (* Assign Initial Values To Input Buffer & State Variables *)
3     Reset(InputFile);
4     Rewrite(OutputFile);
5     PhaseCorrection := 0.0;
6     TrackQualityIndication := 0.0;
7     (* Iterate loop operation while there are input samples *)
8     While Not Eof(InputFile) Do
9       Begin
10        ShiftPhase(PhaseCorrection, InputFile↑, OutputFile↑);
11        PhasorAccumuland.RealPart := OutputFile↑.RealPart+
12                                     TrackQualityIndication;
13        PhasorAccumuland.ImagPart := OutputFile↑.ImagPart;
14        AccumulatePhase(PhaseCorrection,DetectedPhase(PhasorAccumuland));
15        TrackQualityIndication := F*Sqrt(Sqr(PhasorAccumuland.RealPart)+
16                                         Sqr(PhasorAccumuland.ImagPart));
17        Put(OutputFile);
18        Get(InputFile);
19      End;
20    End.

No error detected

Highseg:   1K
Lowseg :   1K
```

What is claimed is:

1. An adaptive recursive phase offset tracking system for acquiring and tracking a received electromagnetic data signal comprising:
  - means for generating a complex baseband signal from the received signal;
  - means for sampling the baseband signal to derive a plurality of complex samples;
  - first filter means for deriving a track quality indication from the complex samples;
  - second filter means having a bandwidth controlled by the track quality indication for extracting a phase estimate from the complex samples; and
  - means for correcting the received data signal in response to the phase estimate to substantially compensate for a phase offset in the received data signal.

2. An adaptive recursive phase offset tracking system for acquiring and tracking a received electromagnetic data signal comprising:
  - a local oscillator;
  - a 90° phase splitter which operates on the output of said local oscillator;
  - first and second demodulators which operate on the received data signal to demodulate the signal in accordance with inputs provided by said 90° phase splitter and said local oscillator;
  - first and second low pass filters which filter the outputs of said first and second demodulators to provide the real and complex components, respectively of a complex baseband signal;
  - means for sampling said baseband signal to derive a plurality of complex samples;

first filter means for deriving a track quality indication from said complex samples;

second filter means having a bandwidth controlled by said track quality indication for extracting a phase estimate from said complex samples; and means for correcting the receied data signal in response to said phase estimate to substantially compensate for a phase offset in the received data signal.

3. The system of claim 2 wherein said means for sampling the complex baseband signal to derive a plurality of complex samples includes gating means connected to the output of said first and second low pass filters and means for timing said gating means to achieve substantially simultaneous operation during predetermined intervals of time.

4. An adaptive recursive phase offset tracking system for acquiring and tracking a received electromagnetic data signal comprising:

means for generating a complex baseband signal from the received signal;

means for sampling said baseband signal to derive a plurality of complex samples;

first filter means for deriving a track quality indication from said complex samples;

second filter means having a bandwidth controlled by said track quality indication for extracting a phase estimate from said complex samples;

means for correcting the received data signals in response to said phase estimate to substantially compensate a phase offset in the received data signal; and said first filter means including:

first and second squaring operators for squaring said complex samples;

means for summing the squared complex samples;

means for providing the square root of the sum of the squares of said complex samples;

means for damping the square root of the sum of the squares of said complex samples;

means for delaying the output of said damping means by one sampling internal; and means for summing the output of said delaying means with the input of one of said squaring operators.

5. The system of claim 4 wherein said second filter means includes a phase detector having inputs provided from the inputs of said squaring operators and means for summing the output of the phase detector with a previous phase estimate.

6. The system of claim 5 wherein said means for correcting the received data signal includes a phase shifter.

* * * * *